324-77
10/5/76    OR    3,984,769

United States Patent [19]
Williams et al.

[11] 3,984,769
[45] Oct. 5, 1976

[54] MIXED-BASE INTERCEPT RECEIVER

[75] Inventors: Richard E. Williams, Fairfax, Va.; John S. Gerig, Palo Alto, Calif.

[73] Assignee: American Standard, Inc., New York, N.Y.

[22] Filed: July 26, 1956

[21] Appl. No.: 600,303

[52] U.S. Cl. ............................. 324/77 E; 324/78 F
[51] Int. Cl.² .................. G01R 23/16; G01R 27/02
[58] Field of Search ............. 250/39, 39.1, 20.41 P, 250/20.37, 20.39, 20.6, 20.3, 20.55, 20.33, 20.33 LO, 39.2; 324/79, 78, 77 E, 78 F; 340/347.1, 347.3, 347.4; 332/1; 333/70 T; 325/332, 363

[56]         References Cited
          UNITED STATES PATENTS

| | | | |
|---|---|---|---|
| 1,982,340 | 11/1934 | Forbes | 250/39 X |
| 1,985,046 | 12/1934 | Morrison | 331/43 X |
| 2,131,559 | 9/1938 | Granger | 250/39 |
| 2,181,265 | 11/1939 | Dudley | 179/100.1 |
| 2,321,315 | 6/1943 | Peterson et al. | 250/39.1 |
| 2,656,459 | 10/1953 | Tinlot | 250/20.3 |
| 2,692,332 | 10/1954 | Godbey | 250/20.3 |
| 2,704,805 | 3/1955 | Byrne | 250/20.41 P |
| 2,729,790 | 1/1956 | Haynes | 332/1 |
| 2,742,566 | 4/1956 | Hunt et al. | 250/27.1 |

FOREIGN PATENTS OR APPLICATIONS

691,239  10/1930  France ............................. 343/105

*Primary Examiner*—Maynard Wilbur
*Assistant Examiner*—T. M. Blum
*Attorney, Agent, or Firm*—Robert G. Crooks

EXEMPLARY CLAIM

1. In a frequency measuring system for measuring and indicating the frequency position of a signal within an extended band of frequencies, wherein said extended band of signals is divisible into a plurality of first sub-bands of equal extent and a plurality of second sub-bands of equal extent, the frequency extents of said first and second sub-bands being respectively different from each other, means for converting said signal to first signals only one of which occurs within each of said first sub-bands, means for further converting said signal to second signals only one of which occurs within each of said second sub-bands, means capable of measuring plural frequency locations within said plurality of first sub-bands for indicating the frequency location within said first sub-band of said first signal, and means capable of measuring plural frequency locations within said plurality of second sub-bands for indicating the frequency location within said second sub-band of said second signal.

34 Claims, 9 Drawing Figures

| ARRAY #1 | #1 | #2 | #3 | #4 | #5 | #1 | #2 |
| ARRAY #2 | #1 | #2 | #3 | #4 | #5 | #6 | #1 |
| ARRAY #3 | #1 | #2 | #3 | #4 | #5 | #6 | #7 |

MIXED-BASE INTERCEPT RECEIVER

The present invention relates generally to frequency measuring apparatus and more particularly to systems for measuring with high accuracy the frequency of a signal of extremely short duration, which may appear momentarily anywhere within a very wide bandwidth.

Systems in accordance with the present invention are capable of analyzing the frequency of signals subsisting within a band of frequencies, with resolution between adjacent frequencies differing by a small fraction of one percent, without undue circuit complexity.

In connection with the following brief description of the invention, it is assumed, for example only, that its application is in a system of reception of electromagnetic wave energy which is required to intercept a frequency bandwidth of 1,000 mc and to measure frequency within 5 mc. The received signal may occur at random and may fall at random in any position with the assumed band. The signal may consist of one or several short pulses. An instantaneous analysis of frequency is required at 100 percent intercept probability, and resort cannot be had to frequency scanning techniques for that reason.

In accordance with a basic concept of the present invention a received signal occurring anywhere in the assumed band of frequencies is mixed in a broad band mixer with a series of harmonically related local oscillator frequencies. Each received signal thus becomes a source of multiple sideband signals by virtue of mixing with the several local oscillator frequencies, and the sideband signals are spaced from each other by increments of frequencies equal to the separation between the local oscillator frequencies. For example, local oscillator frequencies may be selected equal to 10, 20, 30–500 mc, and these may all be of equal amplitude. In such case any incoming signal will generate plural sidebands spaced 10 mc apart and extending throughout bands 500 mc to each side of the incoming signal. A narrow band receiver having a bandwidth, for example, of slightly greater than 10 mc and a center frequency near the center of the assumed 1000 mc wide band, will, therefore, respond to the incoming signal regardless of its location in the 1000 mc band, since one of the generated sidebands must fall within the passband of the receiver. However, inadequate information will be provided relative to the frequency of the incoming signal, since there is no information provided concerning which of the available local oscillator frequencies effected generation of the received sideband.

The simple system above described may be extended in order to enable measurement and identification of the frequency of a received signal. More specifically, a first plurality of receivers is provided which may together cover a band of frequencies equal in width to the frequency separation of the local oscillator signals, each receiver covering a portion of the band and the several receivers being in nonoverlapping relation. For example, if the local oscillator signals are spaced by 25 mc, five receivers may be employed, each covering a band of 5 mc. A further plurality of receivers, say six, may be employed in conjunction with a local oscillator spacing of 30 mc, each receiver having an acceptance band of 5 mc. The system may be farther extended, if desired, in that still a further plurality of receivers may be employed, say seven, in conjunction with a local oscillator spacing of 35 mc, each receiver again having an acceptance band of 5 mc and so on. There are employed, then, three distinct receiver arrays, each employing a gamut of local oscillator frequencies differently spaced, each array including a different number of receivers, and each array extending over the local oscillator spacing associated with the array. All the receivers may be identical in respect to acceptance bandwidth, and the receivers of the several arrays may have center frequencies separated from one another by some integral multiple of five mc, including zero.

Any signal incoming to the system will be received by one of the receivers of each array, and one only, assuming perfect filtering. It is then possible to show, employing congruence algebra, that a total of $5 \times 6 \times 7 = 210$ unique combinations of receiver output will be available, for the specific example hereinabove provided. By observing which receiver in each array passes a signal it is possible to determine the absolute value of the received signal with a resolution of five mc. Accordingly, instantaneous observation and measurement of a frequency within a band 1000 mc wide with a resolution of five mc may be accomplished by means of a total of $5 + 6 + 7 = 18$ receivers, and the code formed by noting which receivers provide output is unique in the observed band.

The philosophy of the present system can be described and clarified through the use of certain relationships which are basic to the algebra of congruences. One such relationship, expressed symbolically as $a \cong b$, (mod $m$), (read $a$ is congruent to $b$ modulo $m$) means that $a$ and $b$ leave the same remainder upon division by $m$, or that $a$ and $b$ differ, if at all, by a multiple of $m$. In the example provided, where 5 mc wide receivers are employed for a sideband separation of 25 mc, the modulo is said to be 25/5 = 5. For a 30 mc separation, employing 5 mc cells, the modulo is 30/5 = 6. The original signal and the frequency displaced signals are said to be congruent, modulo the number of cells in the interval between adjacent sidebands, since the specific cell within which the signal is received provides the remainder, and this remainder is the same for all signals separated by frequency intervals equal to the frequency separtion between sidebands.

If a plurality of receiver arrays are employed, the receivers being identical, but the number of receivers per array differing (a change in modulo), a single received signal will give rise to output in one and only one receiver of each array, and the combination of energized receivers may be uniquely indicative of one frequency if the moduli are properly selected.

It may be shown that if the moduli are relatively prime in pairs, that is, no two have a common factor other than unity, unique solutions will be available equal to the product of the moduli. The number of receivers required in a system using several relatively prime moduli is equal to the sum of the moduli, whereas the attainable frequency resolution is equal to the product of the moduli. The number of cells which can be resolved by a given number of receivers takes a maximum value when the difference between the greatest and least of the moduli is minimized.

A difficulty occurs when a signal falls at the boundary between two receiver bandwidths, since as a practical matter perfect filtering is impossible, and either overlap of receiver acceptance bands, or separation therebetween, is inevitable. To overcome this difficulty the receiver bandwidths may be narrowed, say from 5 mc to 3 mc; and the local oscillator frequencies employed may be varied in one sense periodically over, say, a 2 mc range either directly, or through the use of an auxiliary frequency modulated beat oscillator. Ambiguity of frequency measurement is thus avoided, but the possibility of missing signals exists if these have durations shorter than the time required by the local oscillator frequency to complete an excursion. It may be shown, by statistical analysis, that if the signal is repeated several times, the probability of capture is excellent.

If a 100% probability of capture of a signal is required and ambiguities of frequency measurements are to maintained trivial; i.e., if a measurement error must be not greater than an indication in an adjacent frequency "cell" of 5 mc, a modification of the basic system can yield the required characteristics. The modification consists of making each receiver bandwidth n times the basic cellular bandwidth, where $n$ is the number of moduli of the system—3 in the example. Thus the receivers may be made 15 mc wide in the proposed example. Additionally, the three arrays are mutually offset from one another by the basic cell width of 5 mc. The offset may be achieved by individual receiver tuning or by conventional heterodyne processes. If an incoming signal were swept in frequency over the entire band under examination, only a single adjacent cellular transfer would take place at a time, yielding only trivial ambiguities.

It is, accordingly, an object of the present invention to provide a system of wide band frequency measurement of high accuracy.

It is another object of the invention to provide a system for measuring signal frequency to any desired degree of accuracy over any desired bandwidth by observing responses of a combination of a plurality of filters which are subjected simultaneously to the signal.

It is a further object of the present invention to provide a system of wide band frequency reception by means of a single, relatively narrow band receiver, in which one of a plurality of simultaneously occurring, harmonically related local oscillator frequencies converts the frequency of a signal to a value within the acceptance band of the receiver.

It is another object of the invention to provide a system of frequency analysis in which a carrier frequency occurring at random position in a wide frequency spectrum is caused to generate a large number of sideband frequencies, at least one of which must fall within the acceptance band of a narrow band frequency selective circuit.

It is a further object of the present invention to provide a system of measuring frequency in which a carrier occurring at random position in a wide frequency spectrum is caused to generate a plurality of series of sideband frequencies separated by values congruent to different moduli, where the moduli may be relatively prime in pairs as a further feature.

It is still another object of the invention to provide a system of measuring instantaneously a frequency occurring at random time and position in a wide frequency spectrum, by measuring the frequency positions of a small number of sidebands generated by mixing the frequency under investigation with a plurality of sets of frequencies, the frequencies of the several sets being separated by frequency intervals congruent to different moduli, where said moduli may be relatively prime in pairs.

Still another object of the present invention resides in the provision of a system of signal reception in which a carrier is converted in a plurality of signal channels, each channel including a mixer which mixes the signal with a different array of harmonically related oscillations, the frequency separations between oscillations of the several arrays being frequency separated by values which are congruent modulo different numbers, the numbers being relatively prime in pairs and the sideband frequencies produced by the mixing process in the separate channels being analyzed for frequency position within the channel by means of an array of frequency selective cells, the total bandwidth of each cell being the same throughout the system, and the total frequency coverage of an array of cells being equal to the frequency separation between harmonic frequencies in the associated channel.

It is a further object of the present invention to convert any frequency in a surveillance band to a first plurality of signals separated by a first constant frequency difference, and to a second plurality of sinals separated by a second different constant frequency difference, and to indicate the frequency positions of one of the first plurality of signals and one of the second plurality of signals as a measure of the frequency of the first mentioned frequency.

It is still another object of the present invention to provide a system of frequency measurement of a signal within an extended band of frequencies, which comprise dividing the extended band of frequencies into at least two sets of sub-bands, the frequency extents of the sub-bands of the separate sets being different, converting the signal simultaneously to frequency positions within the sets of sub-bands, one converted signal to each sub-band, and indicating the locations of the converted signal within the sub-bands.

A further object and feature of the present invention resides in the provision of a system for indicating the frequency position of a signal which comprises converting the frequency of the signal to a plurality of discrete, separate frequency arrays, the frequencies of each array spaced apart by a common frequency interval and being different for the several arrays, and indicating the frequency of the signal in the several arrays.

It is another feature of the invention to convert a single frequency to an array of frequencies which are congruent modulo a given number and to a further array of frequencies which are congruent modulo another number, and to indicate the frequency positions of one frequency in each array.

It is a further feature of the invention to convert a single frequency into arrays of frequencies, the frequencies of the separate arrays being congruent to one modulo within an array, yet congruent to different moduli in the separate arrays.

Another object of the invention resides in the provision of a system for converting a frequency to plural arrays of frequencies, the frequencies of the several arrays being congruent, modulo $n, m$ . . . respectively, where $n, m$ . . . may be relatively prime in pairs.

Another object of the present invention resides in the provision of a system for converting frequencies directly into numerical codes.

A further object of the present invention resides in the provision of a system for converting an analogue quantity into a digital quantity, the analogue quantity being frequency, wherein the conversion takes place substantially instantaneously and in a single step.

The above and still further features, objects and advantages of the present invention will become apparent upon consideration of the following detailed disclosures of specific embodiments of the invention, especially when taken in conjunction with the accompanying drawings wherein:

Figure 1:
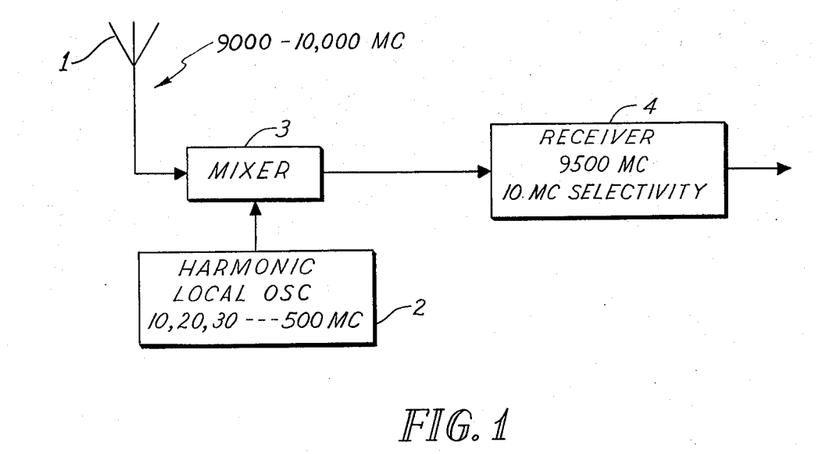
FIG. 1 is a block diagram of a frequency analyzer which employs a harmonic local oscillator.

Referring now more particularly to FIG. 1 of the accompanying drawings, the reference numeral 1 denotes a signal source, specifically an antenna, which is assumed to receive a band of frequencies 1000 mc wide, and specifically to extend from 9,000 to 10,000 mc. A source 2 of harmonically related local oscillator signals is provided, the separation between frequencies of which may be 10 mc, and extending in frequency say from 10 mc to 500 mc or more. All the local oscillator frequencies, assumed of approximately the same amplitudes, together with a signal derived from source 1, are applied to a mixer 3, which may be passive, and the output signals derived from the mixer 3 is applied to a relatively narrow band receiver 4, having an acceptance bandwidth of 10 mc.

The incoming signal then acquires sidebands equal to values spaced by ±10 mc intervals from its own frequency. The receiver may be tuned centrally of the received band, and may have an acceptance bandwidth slightly greater than 10 mc.

Any signal incoming to the receiver 1, regardless of its position within the assumed band of interest; i.e., 9,000–10,000 mc, produces a response in the receiver 4. For example, assume a center frequency of 9,500 mc for receiver 4. If a signal at 9,000 mc is received, the 500 mc local oscillator frequency provides an upper sideband response at 9,500 mc. If a signal at 10,000 mc is received, the 500 mc local oscillator frequency provides, likewise, a lower sideband response at 9,500 mc. If a signal at 9,500 mc is received, it passes directly through the system, and the receiver 4 accepts the carrier and rejects all sidebands.

Figure 2:
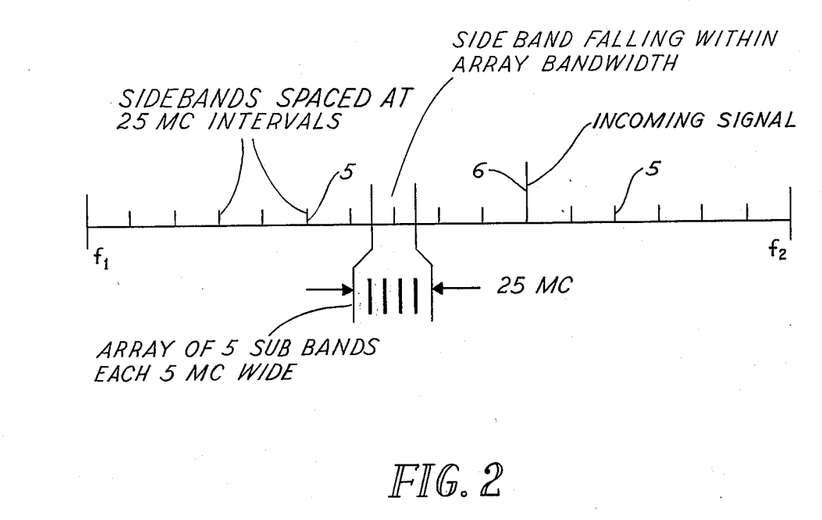
FIG. 2 is a plot of frequency positions of various signals and filters in the system of FIG. 1.

In FIG. 2 of the accompanying drawings is illustrated a plot of sideband frequencies, which are separated by frequency intervals of 25 mc, and are produced by mixing of an incoming signal falling in the band $f_1$–$f_2$, with the output of a harmonic generator which provides a completely filled array of local oscillator frequencies of spacing 25 mc. The incoming signal effects generation of sidebands spaced by 25 mc from the frequency of the incoming signal and extending in the band $f_1$–$f_2$. This would be true for any frequency position of the incoming signal. Accordingly, a receiver, having a reception bandwidth of 25 mc, will have a response regardless of the position of the incoming signal. The receiver bandwidth may be subdivided into an array of five separate sub-bands, for greater resolution, but the defect of the system of FIG. 2 subsists in that the system does not completely locate the incoming signal within the band $f_1$ to $f_2$.

The shortcoming of the system illustrated in FIGS. 1 and 2 of the accompanying drawings is that complete identification of frequency of an incoming signal is not possible. It is frequently desirable or sufficient to indicate the presence of a signal in a given band of frequencies, and its precise value may be of no particular interest. In such case the system of FIGS. 1 and 2 is adequate. A more complex system is required if precise identification of frequency is required. Such a system is illustrated schematically in FIG. 3 of the accompanying drawings, to which reference is now made.

Figure 3:
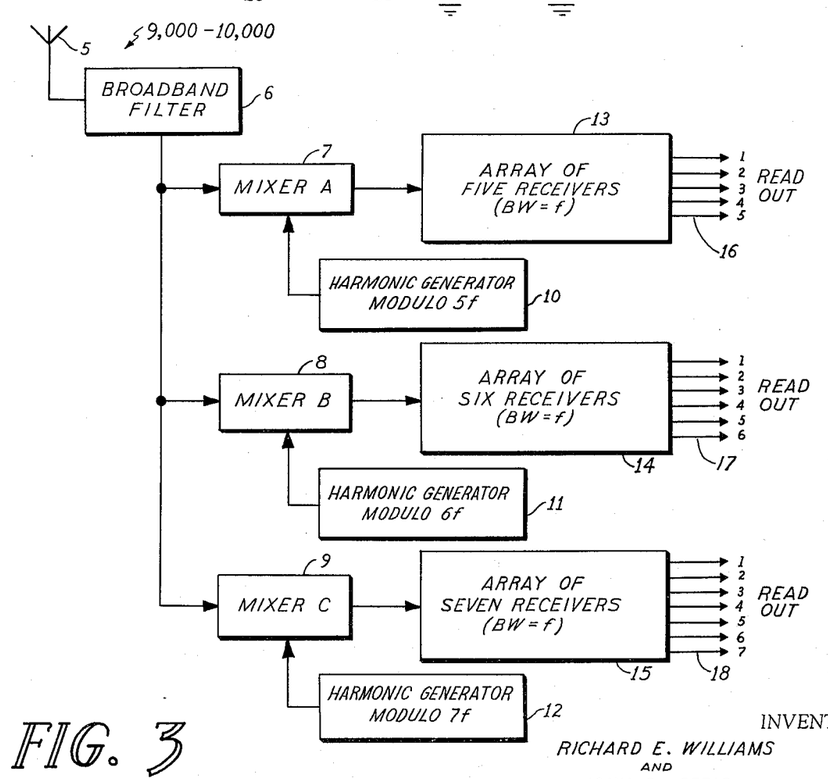
FIG. 3 is a block diagram of a mixed base receiver system, in accordance with the present invention.

In FIG. 3 the reference numeral 5 denotes an antenna, which in its generic significance corresponds with a source of a band of frequencies. For the sake of providing a specific example, the band of frequencies may be 9,000–10,000 mc. This band is passed through a suitable preselector filter 6 and thence in parallel to three mixers 7, 8, and 9. The latter may be passive mixers suitable for the frequency band involved. To each of the respective mixers is supplied a plurality of harmonically related frequencies from harmonic generators, 10, 11, 12, respectively. The outputs of the mixers 7, 8, 9 are supplied respectively to receive arrays 13, 14, 15, each array including a plurality of receivers connected in parallel. The array 13 includes five receivers, of bandwidth $f$ = 5 mc, and lying adjacent to one another in frequency so that the array covers a band 25 mc wide. The harmonic generator is described as providing frequencies having values which are congruent modulo 5 $f$, which implies in mathematical language that any of the harmonic frequencies, if divided by 5 $f$; i.e., 25, leave the same remainder. The harmonic generators 11 and 12 provide frequencies which are congruent modulo 6 $f$ and 7 $f$ respectively. In general if $f$ is the bandwidth of a single receiver, assumed a constant for all receivers of the system, and if $n$ be the number of receivers in a given array, the harmonic frequencies employed for generating a response in one of the receivers of the array are always congruent modulo $nf$. Accordingly, in the specified example, the harmonic generator 10 provides frequencies separated by 25 mc, the harmonic generator 11 provides frequencies separated by 30 mc, and the harmonic generator 12 provides frequencies separated by 35 mc.

It will be clear, if each series of harmonics extends over a band of at least 500 mc, in the assumed example, the separate series commencing at values 25, 30, and 35 mc, respectively, that any signal received within the band 9,000 to 10,000 mc will produce a response in each of the receiver arrays, assuming the latter to be centered on 9,500 mc. As the band of harmonic frequencies extends beyond 500 mc, the center frequencies of the arrays may, obviously, depart correspondingly from the center of the band of interest; i.e., 9,500 mc.

Any viewed signal, moreover, will generate a response in one, and only one, of the receivers of each array, assuming perfect filtering; i.e., receivers having vertical skirts in their selectivity curves.

It can be shown that the combination of receivers in which response is generated, one from each array, is indicative without ambiguity of the value of one received frequency. It follows that if numeral indicators be applied to the several read-out leads 16, 17, 18 from the receiver arrays, the first array carrying the numerals 1–5, the second the numerals 1–6, and the third the numerals 1–7, and if these numeral indicators are activated by a signal of any given frequency, that the three numeral code number of word indicated, one numeral from each array, represents the frequency of reception, albeit not in decimal notation.

It is desirable, in order that each different code number which may possibly be generated shall represent a unique frequency, that the several moduli employed be relatively prime in pairs; or more generally that the numbers of receivers per array may be congruent modulo $n, m$ . . . respectively, the values of $n, m$ . . . being relatively prime in pairs. The number of receivers required is equal to the sum of the moduli, and the bandwidth covered is equal to the product of the moduli times the bandwidth per receiver. The number of receiver bandwidths, frequency increments or cells, which can be resolved by means of a given number of receivers, assumes a maximum value when the difference between the greatest and smallest moduli employed is minimized.

Referring more particularly to the specific system and the specific values described in conjunction with FIG. 3 of the accompanying drawings, the moduli employed are 5, 6, and 7 and the receiver bandwidth $f$ is 5 mc. The numerals 5, 6, and 7 are relatively prime in pairs. It follows that a total of $5 + 6 + 7 = 18$ receivers cover a band of $5 \times 6 \times 7 \times 5 = 1050$ mc. The response of the receiver arrays; i.e., the code representative of that receiver in each array which receives a given signal, uniquely indicates or represents that frequency.

The choice of moduli for any particular application is determined on consideration of probable equipment complexity to obtain desired resolution, sensitivity and the like. The use of tri-modulo systems appears optimum for resolutions of one part in a few hundreds; whereas, for resolutions of one part in a few thousands quad-modulo systems generally will prove more efficient; i.e., the system will require four arrays of receivers.

Generation of the required harmonic frequencies of uniform amplitude may be accomplished in several ways, which are not novel per se, and which are therefore not illustrated nor described in detail. For example, millimicrosecond pulses may be generated having a pulse repetition rate equal to the basic sideband interval. In the alternative multiple oscillators may be employed which are locked to one another in harmonic relation, and which are per se rich in harmonics.

Figure 4:
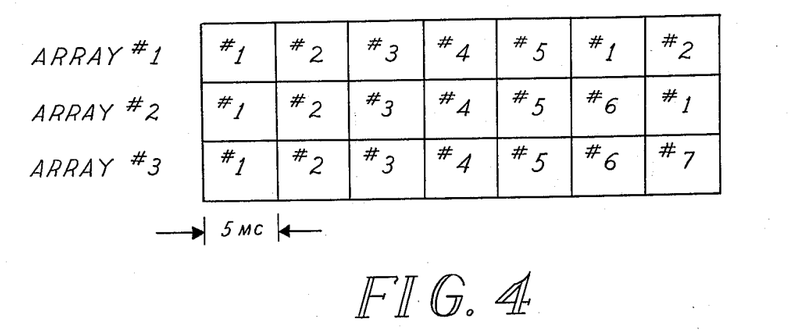
FIG. 4 is a plot of all positions in the system of FIG. 3.

The operation of the system of FIG. 3 may be clarified by reference to FIG. 4. In that figure the receiver arrays 13, 14, 15 of FIG. 3 are exemplified by three arrays of cells, these being identifiable as No. 1, No. 2 and No. 3. The cells of the several arrays are numbered in order, and represent the several receivers of the arrays 13, 14, 15.

The process of coding any frequency in a wide frequency band in accordance with the present invention, may be exemplified as follows. Assume that the cells employed are precisely 5 mc wide, and that cell arrays of 5, 6 and 7 cells are employed and superposed in frequency, as indicated in FIG. 4, i.e., with the first cell of each array precisely superposed on the first cell of the others, and the succeeding arrays following in close order.

In such case, it may be assumed that there is a frequency for which cells No. 1 respond in the several arrays. As the assumed frequency, increases in steps of 5 mc, it will progressively fall within all the No. 2 cells, all the No. 3 cells, all the No. 4 cells and all the No. 5 cells, advancing one cell place for each 5 mc increase until cells No. 5 have been reached.

One further 5 mc advance in frequency, then, returns the responses to cell No. 1 of array No. 1, but in arrays No. 2 and No. 3 the responses proceed to cells No. 6, respectively. On one further 5 mc advance in frequency the responses will occur in cells No. 2, No. 1 and No. 7 of the respective arrays. By continuing the process it will be apparent that each advance of frequency equal exactly to 5 mc will cause a relative cell displacement in adjacent cell arrays equal to one cell. The arrays No. 1 and No. 2 are therefore capable of coding $5 \times 6 = 30$ frequencies without redundance, after which the cycle recommences. Array No. 3, however, provides seven code positions for each 30 code positions provided by arrays No. 1 and No. 2 in combination, so that $5 \times 6 \times 7$, or 210 five mc steps may be taken without redundance.

Certain ambiguities may appear in the system as described, by reason, primarily, of the fact that it is difficult to construct receivers which are tuned to precisely adjacent frequencies and which do not overlap; i.e., which have perfectly sharp skirt selectivity. The possibility of ambiguity may be completely removed by making each receiver somewhat narrower in passband than the value required to cover a band segment completely; i.e., gaps are left between the receivers of each array. The receivers may then be rapidly frequency-scanned or "jittered" to fill in the gaps. During the frequency scan the spacing between receivers is retained so that response to a single pulse can occur at only one receiver of each array at any one time, or may occur in a gap. If a signal is repetitive, however, successive acquisition may occur at random times by two adjacent receivers of each array. This leads to erroneous indication. In order to eliminate the error it is sufficient to terminate the scan in response to acquisition of a first of a sequence of repetitive signals. Further, since the response of the system may require a fraction of a microsecond, a memory system is required in the output leads of the receivers so that once an indication has occurred, it will be retained until its value has been assimilated by an observer.

Figure 5:
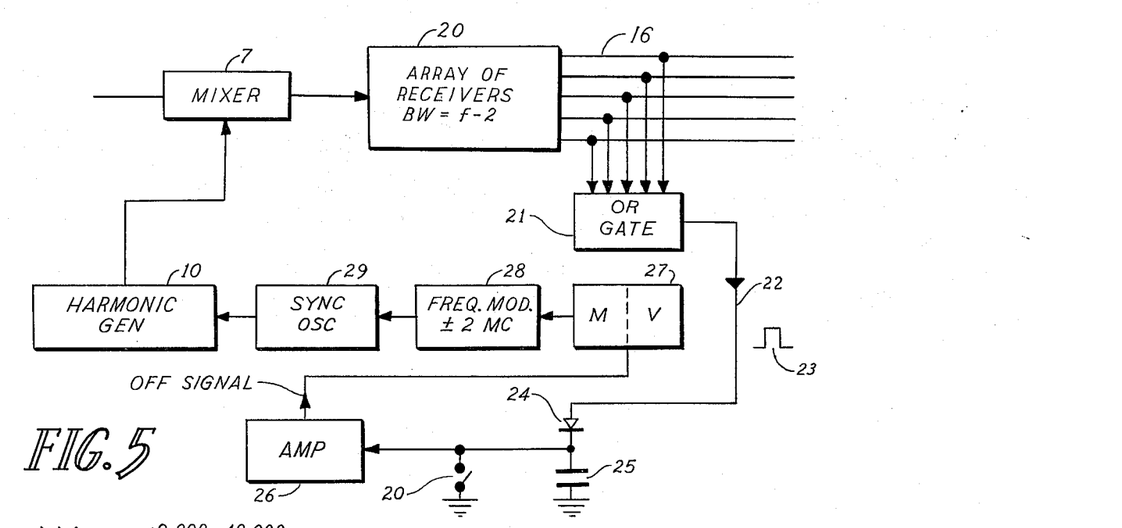
FIG. 5 is a block diagram of a portion of the system of FIG. 3, adequate to illustrate a modification of the latter system.

Reference is made to FIG. 5 of the accompanying drawings, where is illustrated in schematic block diagram a scanning and lock-on system, which is applicable to the system of FIG. 2. Here, the array of receivers, 13, of FIG. 2, taken for example only, is modified so that each receiver has a bandwidth of 3 mc instead of 5 mc, providing a guard band of 2 mc between each pair of adjacent frequencies. The receiver, 20, is provided with output leads 16, which are jointly connected with an OR gate 21. The latter provides an output signal on lead 22, in response to occurrence of a signal on any one of leads 16. This output signal may take the form of a positive pulse 23, which passes via isolating diode 24 to a storage condenser 25. The charge on condenser 25 introduces a bias change at the input of amplifier 26, which is arranged to operate without discharging the condenser 25 in a manner well known per se. The amplifier 26 supplies an "OFF" gating signal to multivibrator 27, preventing further oscillation of the latter for the duration of the output signal.

The multivibrator 27 is normally free running, at a high rate, say 1 mc, and applies square wave, sawtooth waves, or otherwise shaping modulating signal to frequency modulator 28, which has a frequency excursion of 2 mc in one direction, followed by a return. The frequency modulator 28 modulates the frequency of a master or sync oscillator 29, which serves to modulate the frequencies of the harmonic generator 10, which is synchronized by the sync oscillator 29.

Accordingly, the multiple frequency outputs of the mixer 7 are shifted or jittered in frequency continuously, in the absence of signal, and at a rapid rate. Any incoming signal may fall in the gap between two receivers of the array 20, or may be brought into one only of the two receivers, by virtue of the scanning process, depending on the relative times of scan and signal. A signal having been intercepted by one of the array of receivers 20, an "OFF" gating signal is generated and stored, and the scanning process is stopped at the receiver tuning which obtained at the time of interception is maintained. The signal energized receiver of array 20 may be noted, and thereafter the condenser 25 discharged by closing switch 30, to permit the scanning operation to recommence.

It will be clear that the scanning operation may be performed in other ways than that stated, for example, by frequency scanning the total input band. The suggested system is, accordingly, exemplary only.

In the system of FIG. 2, as modified in accordance with the teaching of FIG. 5, frequency scanning may be terminated by a pulse at any one output lead of one receiver array of the system, which may represent noise. It is more desirable that this action occur only in response to simultaneous reception of a signal in each of three receiver arrays, in a tri-modulo system, whereby effective signal-to-noise ratio of the system is increased by a factor of about 5 db.

Figure 6:
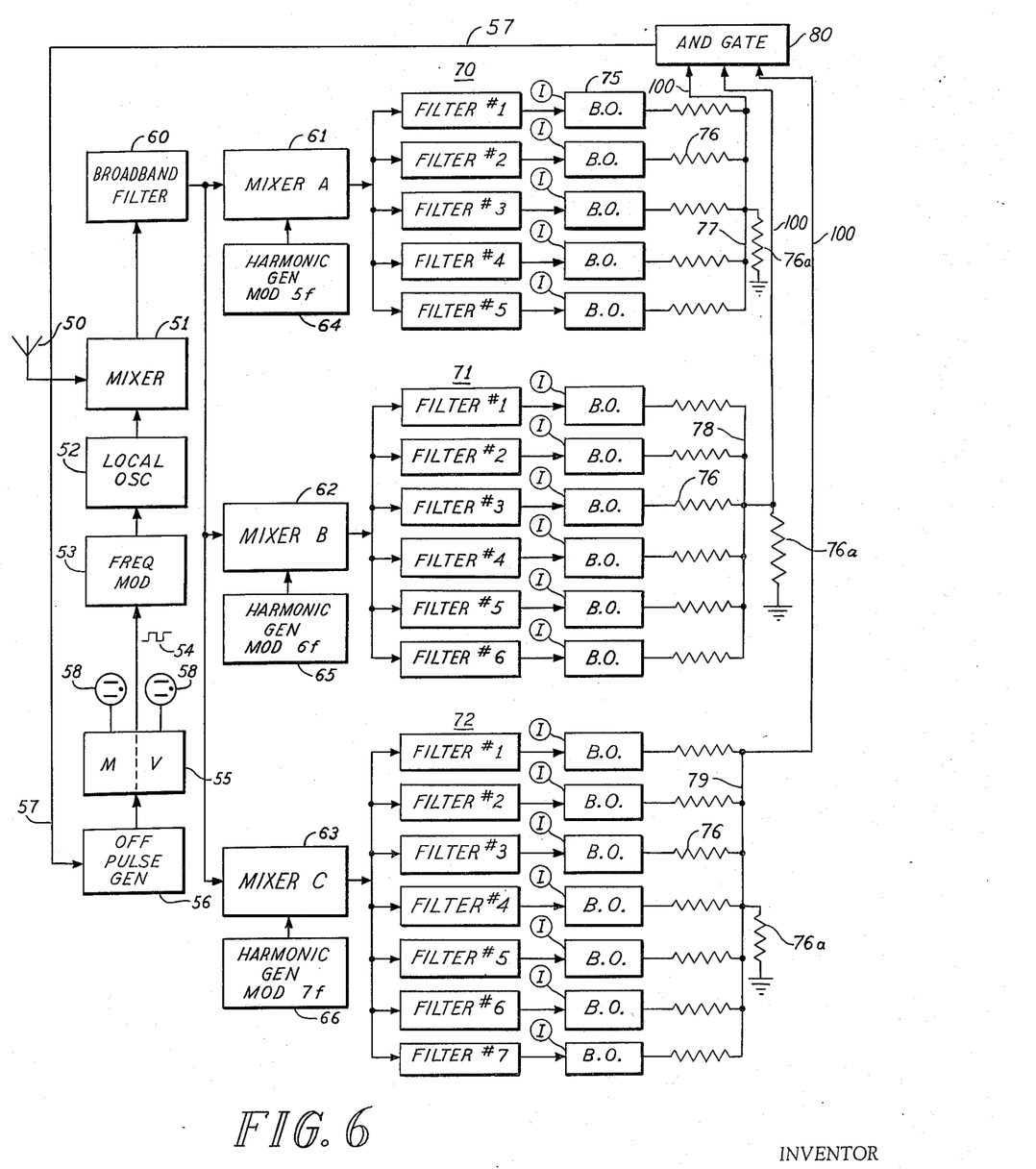
FIG. 6 illustrates in block diagram a further modification of the systems of FIGS. 3 and 5.

In FIG. 6 of the accompanying drawings is illustrated a tri-module system in accordance with the invention, which employs frequency-scanning, and lock-on of the scan, but in which lock-on occurs only in response to simultaneous response of all three receiver arrays to a signal. A signal is intercepted at a broadband antenna 50, which represents a signal source. The signal is mixed in a mixer 51 with local oscillator frequency from a local oscillator 52. The frequency of the local oscillator 52 is modulated rapidly by a frequency modulator 53, which is responsive to a square voltage wave 54 supplied by a multivibrator 55. The latter is free running, but may be locked in its last condition in response to an "OFF" pulse supplied by a pulse generator 56. The latter is responsive to control signal supplied over a lead 57, so that multivibrator 55 remains in its last condition while signal is present on lead 57. Indicators, such as neon cells, 58, are provided in conjunction with multivibrator 54, to indicate visually the last operative state of the latter, and if desired a pulse lengthener (not shown) may be included in the lead 57 so that a single short pulse may effect a long dwell in the frequency scanning process.

We now have an incoming signal, at broadband filter 60, which is "jittered" in frequency, and the frequency excursion employed may equal 2 mc, following the teaching of FIG. 5.

The output of broadband filter 60 is applied in parallel to three mixers, 61, 62, 63, which are respectively supplied with multiple local oscillator frequencies from harmonic generators 64, 65, 66. The spacing of the frequencies supplied by generators 64, 65, 66 are respectively modulo $5f$, $6f$, and $7f$, or 25 mc, 30 mc, and 35 mc, as in the specific example hereinabove employed.

The output of mixer 61 is applied in parallel to an array of five filters, 70, occupying corresponding positions in adjacent frequency cells and having bandwidths of 3 mc, to accommodate the specific frequency "jitter" of 2 mc provided at local oscillator 52. The cells in the example are 5 mc wide, when account is taken of the extent of scanning plus the unscanned bandwidth of the circuit.

A similar array 71 of six filters is connected to the output of mixer 62, and a further similar array 72 of seven filters is connected to the output of mixer 63.

Any single received signal will provide a response in one and only one of the filters of each of arrays 70, 71, 72. The filters 70, 71, 72 may, in physical embodiments, consist of complete receivers, which may be quite sensitive, and not quite noise-free. The separate filters of arrays 70, 71, 72 may, accordingly, generate noise pulses at random times, and these may occur in one filter at a time. It is characteristic of true intercepted signals to provide an output simultaneously in a set of filters consisting of one filter of each array. To assure that frequency scan will not terminate until a true signal has been intercepted, the output of each of the filters of arrays 70, 71, and 72 is connected to activate a separate blocking oscillator, which are severally identified by reference numeral 75. The cathode circuits of the blocking oscillators 75 include separate resistors 76, all connected to ground via a common resistance 76a, and the respective resistances 76a associated with the blocking oscillators of each array are connected together by separate leads 77, 78, 79, which are in turn connected as input leads to an AND gate 80. On receipt of a pulse in any of filters 70, the associated blocking oscillator, 75, conducts heavily, biasing off the remaining blocking oscillators associated with that array. Accordingly, each array can provide only one signal to the AND gate 80, which is representative of one operative filter only. The AND gate 80, on the other hand, supplies output signal to lead 57 only if it is simultaneously supplied with signal from all three filter arrays, 70, 71, and 72. The system is, accordingly, seized by the first signal to arrive while the system is open, and only that signal can produce a coded output indication until such time as the system clears again. The clearance time involved may be that of the blocking oscillators, and the system output may be read from indicators I, associated one-for-one with the blocking oscillators.

The systems hereinbefore described in detail which do not use the jitter modification of FIGS. 5 and 6 are all susceptible to ambiguity, especially in that a variation in frequency which is adequate to cause transfer of response from one cell to an adjacent cell generally effects a code change in all three places of the three letter code representative of any frequency. For example, if a frequency Fa gives rise to coded responses in cells 345, a shift should generate a response in cells 456, if the shift takes place across the boundaries of the cells. In fact, if one numeral fails to change this indicates a gross ambiguity in the final total indication. It is desirable that a continuous frequency-coverage system be provided in which small variations in frequency, or frequencies which may generate responses in adjacent cells, shall generate code changes in one significant figure only. This may be accomplished, in a tri-modulo system by a modification of the system which utilizes triple width cells, but displaced adjacent arrays of cells by ⅓ cell width. In general, in $n$-modulo systems, the widths of all cells may be increased by a factor of $n$, and the displacement may be $1/n$ of a cell-width.

Figure 7:
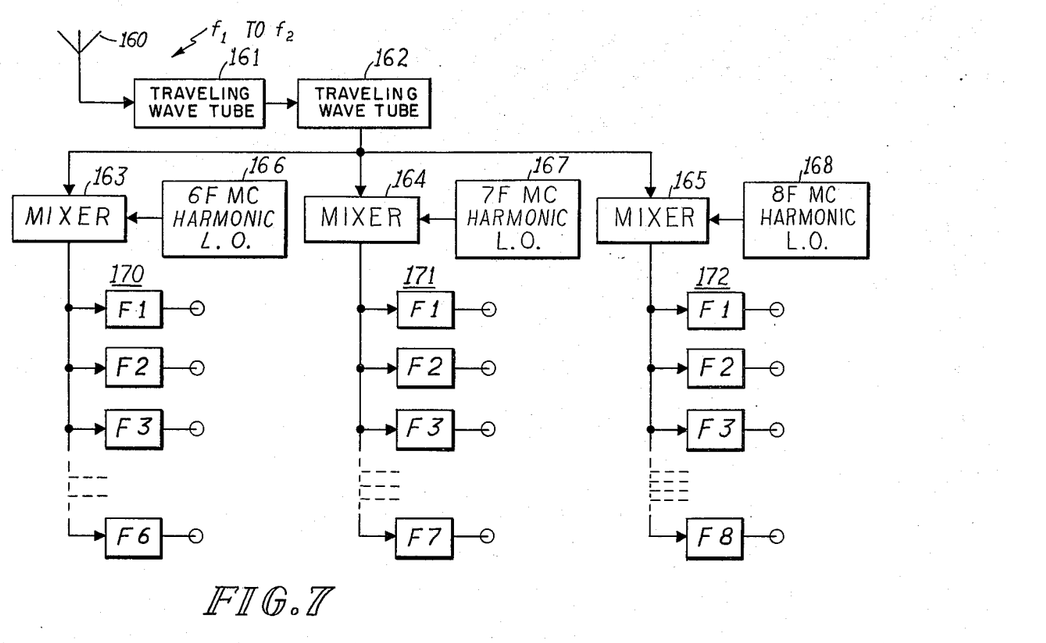
FIG. 7 illustrates in block diagram a further modification of the system of FIG. 3, employing frequency displaced filters, in the several selective arrays of FIG. 3.

Reference is made to FIG. 7 of the drawings, wherein is illustrated an arrangement of cells, in accordance with the last mentioned embodiment of the invention.

In the modification of our invention illustrated in FIG. 7 of the accompanying drawings, the antenna 160 serves as a signal source for a signal which may, for purpose of illustration, be assumed to subsist somewhere in the frequency band $f_1$ to $f_2$, about 3000 mc wide, and to consist of randomly occurring pulses, having durations as short as .25 microseconds.

The signals intercepted by antenna 160 are amplified to relatively high levels by means of traveling wave tubes 161 and 162, connected in cascade, and are thence applied in parallel to mixers 163, 164, and 165. To the mixer 163 is applied the output of a harmonic local oscillator, 166, generating frequencies separated by 6F mc. The mixer 164 is connected to a harmonic local oscillator, 167, which generates frequencies separated by 7F mc; while the mixer 165 is connected to a harmonic local oscillator 168, generating frequencies separated by 8F mc. The modification illustrated in FIG. 7, as described, employs receiver arrays modulo 6, 7, 8 which are not relatively prime.

Figure 8:
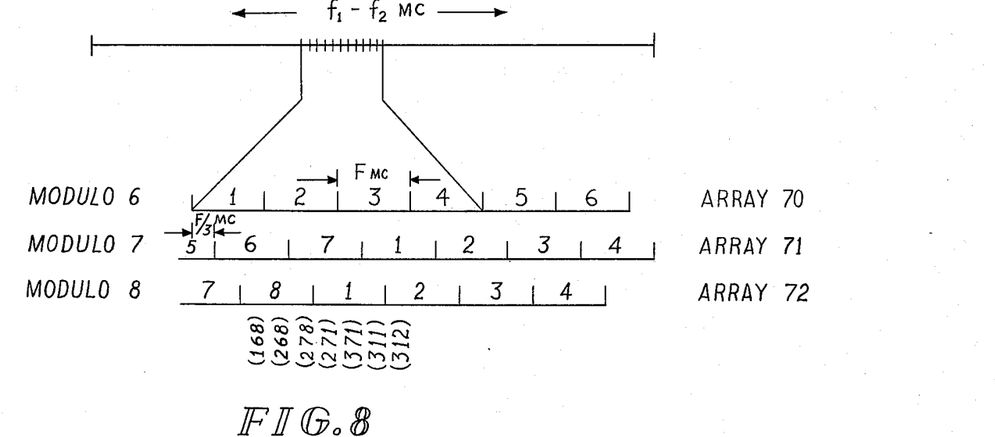
FIG. 8 is a diagram showing the ambiguity free coding attainable in the system of FIG. 7.

The mixers 163, 164, 165 are connected respectively to three separate arrays of filters, the separate arrays being identified by numerals 170, 171, and 172, and the separate filters of the arrays by the letters F followed by a numerical subscript which identifies the position of the filter in the array. Each filter has an acceptance band width of F mc; the acceptance bands in each array lying adjacent, as indicated in FIG. 8. The filters of array 171 have passbands the lower edges of which are offset F/3 mc above the lower edge of the adjacent filters in the array 170, while the lower edges of the filters of array 172 subsist F/3 mc above the lower edges of the filters of array 171.

If, now, the progress of the coded indications at the ouputs of the several filters be traced as the intercepted frequency increases in steps of F/3 mc, the following typical code sequence is generated:

157
167
168
268
278
271

It will be noted that adjacent code words differ at most by one significant figure, although the change may occur at any position of the code word.

While the specified code provides a one digit change for each frequency change F/3, a modulo three system may be employed having an overlap of F/2. In such case adjacent codes will be such that one position of the code will not change and the remaining positions only change by, at most, one value for each of the specified frequency quanta. A typical sequence of codes would then run, for moduli 5, 6, 7, as follows:

167
117
211
221
322
332
433
443

While in the case of nonoffset systems of coding, maximum coding efficiency is obtainable by utilizing relatively prime moduli. This is no longer true in offset systems, and maximum coding efficiency must be derived in offset systems by a trial and error selection of moduli. The term coding efficiency means the ratio of the number of consecutive code words which can be obtained without repetition or ambiguity in a given total number of code words.

Figure 9:
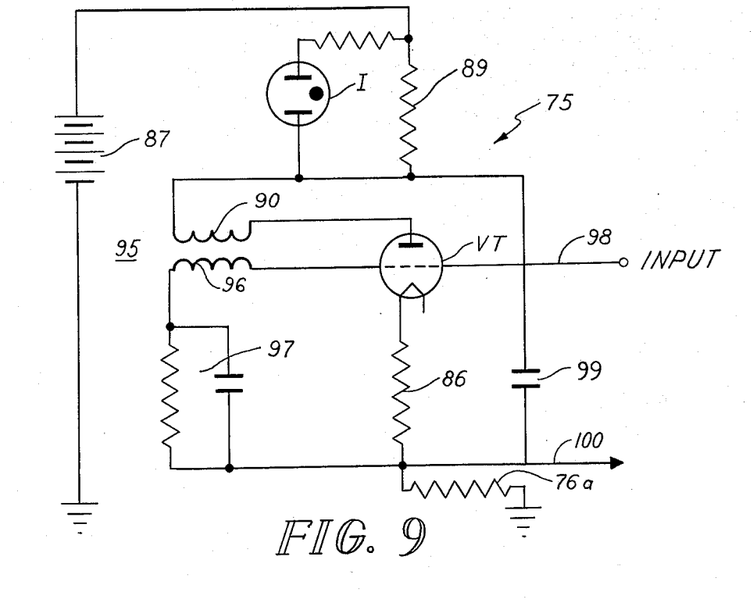
FIG. 9 is a schematic circuit diagram of a typical read-out indicator circuit as employed in the invention.

Referring now more particularly to FIG. 9 of the accompanying drawings, The reference letters VT denote a vacuum tube of a blocking oscillator 75, which may be specifically a triode, if desired. The unbypassed resistance 86 is connected in the cathode circuit of the triode VT. A source of anode supply voltage 87 is conventionally illustrated as a battery and is connected between a point and an anode load 89. In series between the anode load 89 and the anode of triode VT is connected a primary winding 90 of a feedback transformer 95. The secondary winding 96 of transformer 95 is connected at one terminal to the grid of triode VT, and at its other terminal in series with a grid leak and condenser 97. A visual indicator such as a neon cell I is connected across the anode load 89, and an input lead 98 is connected to the grid of triode VT. If desired, a condenser 99 may be connected between the high voltage terminal of primary winding 90 and ground.

The triode VT is biased to cutoff in the absence of input signal at the grid of triode VT. In this condition the condenser 99 is charged and no voltage appears across the indicator I.

On receipt of a positively going input signal, the triode Vt becomes conductive. The transformer 90 is poled to regenerate the input signal so that the triode VT is rapidly driven to saturation. The condenser 99 discharges during the latter process, which accelerates the anode current change. While heavy anode current flows, a high voltage develops across anode resistance 89 and across cathode resistance 86. The former voltage causes a visual indication by firing visual indicator I. The latter develops a positive gating voltage at lead 100 for application to AND gate 80.

While we have described herein several modifications of our invention, which are generally related, it will be clear that further modifications and arrangements may be resorted to without departing from the true spirit and scope of the invention which is defined in the appended claims.

What we claim is:

1. In a frequency measuring system for measuring and indicating the frequency position of a signal within an extended band of frequencies, wherein said extended band of signals is divisible into a plurality of first sub-bands of equal extent and a plurality of second sub-bands of equal extent, the frequency extents of said first and second sub-bands being respectively different from each other, means for converting said signal to first signals only one of which occurs within each of said first sub-bands, means for further converting said signal to second signals only one of which occurs within each of said second sub-bands, means capable of measuring plural frequency locations within said plurality of first sub-bands for indicating the frequency location within said first sub-band of said first signal, and means capable of measuring plural frequency locations within said plurality of second sub-bands for indicating the frequency location within said second sub-band of said second signal.

2. The combination in accordance with claim 1 wherein said means for indicating includes a first array of filters each of predetermined bandwidth, only one filter in said first array having a pass band to pass only one of said further signals, a further array of filters each of predetermined band coverage, only one filter in said second array having a pass band to pass only one of said further second signals, whereby said frequency positions are indicated in terms of the responsive filters of both arrays of filters.

3. The combination in accordance with claim 2 wherein at least certain of said filters are of selectivity narrower than the band coverage thereof, and wherein certain of said further first signals and further second signals are frequency modulated sufficiently to provide said band coverage.

4. In a frequency measuring system for measuring and indicating the frequency position of a signal within an extended band of frequencies, wherein said extended band of signals is divisible into a first plurality of contiguous sub-bands of equal extent and a second plurality of contiguous sub-bands of equal extent, the frequency extents of said first and second sub-bands being different, means for converting said signal to further first signals only one of which occurs within each of said first plurality of sub-bands, further means for converting said signal to further second signals only one of which occurs within each of said second plurality of sub-bands.

5. The combination in accordance with claim 4 wherein is provided means for indicating the frequency positions of said further first signals and said further second signals within the respective sub-bands.

6. In a frequency measuring system, a source of signal occurring at a random frequency within a predetermined frequency band, means for converting said frequency to a plurality of first spaced frequencies distributed over said frequency band at equal frequency separations equal to $n$, where $n$ is a number, means for converting said frequency to a further plurality of spaced frequencies distributed over said frequency band at equal frequency separations equal to $m$, where $m$ is a number not equal to $n$, and means for indicating the value of said random frequency in terms of the combination of the values of said first spaced frequencies and of said further plurality of spaced frequencies, wherein said last named means includes means to indicate more than one spaced frequency in both said first spaced frequencies and said further plurality of spaced frequencies.

7. In an input signal frequency measuring system, a first plurality of band-pass filters of different band-pass frequencies and together extending over a band of frequencies NF, a second plurality of band-pass filters each of different band-pass frequencies and together extending over a band of frequencies MF, where N and M are relatively prime integers and F is a band of frequencies, means for deriving from said input signal equal separated frequencies separated by NF, means for applying said equally separated frequencies separated by NF to said first plurality of band-pass filters, means for deriving from said input signal equally separated frequencies separated by MF, means for applying said equally separated frequencies separated by MF to said second plurality of band-pass filters.

8. In a frequency measuring system a source of signal occurring at random frequency within a frequency band, a source of first local oscillator signal frequencies spaced by $n$ cps, where $n$ is a number, means for mixing said signal occurring at random frequency with all said first local oscillator signal frequencies, whereby there is generated a plurality of first converted frequencies separated by $n$ cps, a source of second local oscillator signal frequencies spaced by $m$ cps, where $m$ is an integer not equal to $n$ means for mixing said signal occurring at random with all said second local oscillator signal frequencies, whereby is generated a plurality of second converted frequencies separated by $m$ cps, means capable of measuring plural frequency positions of said first converted frequencies for indicating the frequency positions of at least one of said first converted frequencies with respect to a reference frequency, and means capable of measuring plural frequency positions of said second converted frequencies for indicating the frequency position of at least one of said second converted frequencies with respect to said reference frequency.

9. The combination in accordance with claim 8 wherein said value $m$ is divisible by the numerical value of a common frequency increment and said value $n$ is divisible by said numerical value of said common frequency increment, and wherein the quotients of said divisions are relatively prime.

10. In a frequency measuring system a source of signal occurring at a random frequency within an extended frequency band, a source of first frequencies separated from each other by equal spacings $n$ which are smaller than the spacing between the terminals of said extended frequency band, means for algebraically adding to said random frequency said first frequencies to provide first mixed frequencies, an array of $a$ first receivers of equal bandwidths of receptivity, said array of first receivers respectively arranged to receive one of said mixed frequencies only in one of said receivers only at any instant of time, a source of second frequencies separated from each other by equal spacings $n$ which are smaller than the spacing between the terminal frequencies of said extended frequency band, means for algebraically adding to said random frequency all said second frequencies to provide second mixed frequencies, a further array of $b$ receivers of said equal bandwidth receptivity, said further array of receivers arranged to receive one of said mixed frequencies only in only one of said receivers at any instant of time, wherein $a$ is not equal to $b$ and $m$ is not equal to $n$, where $a$, $b$, $m$ and $n$ are numbers.

11. The combination in accordance with claim 10 wherein said first receivers are arranged to receive signals in immediately adjacent bands.

12. The combination in accordance with claim 10 wherein said first receivers are arranged to receive signals in nonadjacent bands.

13. The combination in accordance with claim 10 wherein said receivers are frequency scanning receivers each arranged to scan periodically over its bandwidth of receptivity.

14. In a frequency measuring system for measuring and digitally indicating the frequency position of a signal, means for converting the frequency of said signal to a plurality of discrete signal arrays, each of said arrays consisting of a plurality of further signals at discrete frequencies spaced apart by a common predetermined frequency interval, said frequency intervals different for the several arrays by a respective integral number S multiplied by a number representing width of a similar frequency band $f$, where S may include unity, a different plurality T of filters having nonoverlapping acceptance bands responsive to each of said arrays, said acceptance bands equal for all said filters, and equal to $f$, and the filters for each of said arrays arranged to accept one only of said further signals, and means for indicating the responses to said further signals of all said filters.

15. In a frequency measuring system for measuring and indicating the frequency position of a signal within a band of frequencies, means for converting the frequency of said signal to a plurality of discrete sets of signals, each of said sets consisting of a plurality of signals at discrete frequencies spaced apart by a common predetermined frequency interval, said frequency intervals different for the several sets, and means for indicating the frequencies of the signals in said sets as a measure of the frequency position of said a signal said last named means providing an indication for all frequencies within each of said sets.

16. A system for measuring frequency comprising, a source of input signal at said frequency, a source of a plurality of first mixer signals, said first mixer signals having pairs of discrete frequencies separated by a first frequency interval, means for mixing said first mixer signals with said input signal to derive a plurality of conversion products having adjacent frequencies separated by to said first frequency intervals and having frequency positions with respect to a reference value determined by the frequency of said input signal, a source of a plurality of second mixer signals at discrete frequencies separated in pairs by a second frequency interval, means for mixing said second mixer signals with said input signal to derive a plurality of conversion products having adjacent frequencies separated by to said second frequency interval and having frequency positions with respect to a reference value determined by the frequency of said input signal, said first and second frequency intervals having different values, means capable of measuring plural frequency positions of said first conversion products for measuring the frequency positions of one of said first conversion products, and means capable of measuring plural frequency positions of said second conversion products for measuring the frequency position of one of said second conversion products.

17. A system for measuring frequency, comprising a source of signal occurring at random position and time in a frequency band, a first harmonic local oscillator, a second harmonic local oscillator, said first harmonic local oscillator arranged to generate harmonically related frequencies spaced by a first frequency interval, said second harmonic local oscillator arranged to generate harmonically related frequencies spaced by a second and different frequency interval, said first frequency interval equal to $mF$ where $m$ is an integer and $F$ a frequency sub-band, said second frequency interval equal to $nF$ where $n$ is an integer, means for indicating the location of said signal with respect to the frequency interval $mF$, comprising a first array of $m$ substantially nonoverlapping filters each accepting a bandwidth F, means for indicating the location of said signal with respect to the frequency interval $nF$ comprising a second array of $n$ substantially nonoverlapping filters each accepting a bandwidth F, the lower edges of the acceptance bands of the filters of said first array being displaced from the lower edges of the acceptance bands of the filters of said second array by a frequency interval $F/a$, where $a$ is an integer.

18. The combination in accordance with claim 17 wherein $a$ is equal to two.

19. In combination, a first mixer, a second mixer, a source of an input signal connected to said first and second mixers for frequency conversion therein, a first harmonic local oscillator coupled to said first mixer, a second harmonic local oscillator coupled to said second mixer, N first frequency selective devices having respectively different pass bands coupled in parallel to said first mixer and arranged and adapted for deriving heterodyne products from said mixer, M second frequency selective devices having respectively different pass bands coupled in parallel to said second mixer and arranged and adapted for deriving heterodyne products from said second mixer, the harmonics of said first harmonic local oscillator having a frequency separation NF, the harmonics of said second harmonic local oscillator having a frequency separation MF, where F is a frequency band common to all said frequency selective devices, and N and M are different integers.

20. The combination according to claim 19, wherein the pass bands of said first and second frequency selective devices are non-coincident.

21. The combination according to claim 19, wherein the pass bands of said first and second frequency selective devices are overlapping and non-coincident.

22. The combination according to claim 19, wherein the pass band of at least one of said first frequency selective device corresponds with the pass band of at least one of said second frequency selective devices.

23. In a frequency measuring system for a frequency within a first band of frequencies, means for converting an input signal to a plurality of first signals having frequencies separated by NF, means for converting said input signal to a plurality of second signals having frequencies separated by MF, where N and M are relatively prime numbers, means for indicating the frequency position of one of said first signals with respect to the frequency band NF, and means for indicating the position of one of said second signals with respect to the frequency band MF, where F is a band of frequencies, wherein both said means for indicating provide indications for all frequencies within said first band.

24. In a system of measuring input frequency of an input signal, means for converting said input frequency to a first set of first frequencies separated by MF, where F is a frequency band and M a number, means for converting said input frequency to a second set of second frequencies separated by NF, where N is a number not equal to M and means for always measuring the frequencies of one of said first frequencies and of one of said second frequencies said last named means including means for measuring plural frequencies.

25. In a system of measuring a frequency within a first band of frequencies, means for converting said a frequency to a plurality of first frequencies all adjacent ones of which are separated by a first frequency separation NF, where N is a first number and F is a band of frequencies, means for converting said a frequency to a plurality of second frequencies all adjacent ones of which are separated by a second frequency separation MF, where M is a second number different from N, means for measuring the frequency position of one of said first frequencies with respect to a band of frequencies NF wide, and means for measuring the frequency position of one of said second frequencies with respect to a band of frequencies MF wide, wherein both said measuring means provide measurements for all frequencies within said first band.

26. The combination according to claim 25 wherein M and N are integers having a common integer factor.

27. The combination according to claim 25 wherein M and N are integers having no common integer factor.

28. In a system for measuring a frequency, means for converting said frequency to a plurality of frequency arrays, wherein all adjacent frequencies of each of said arrays are separated by a fixed frequency separation, said separations being different for different ones of said arrays and the same within each of said arrays, and means capable of measuring plural frequencies within each of said arrays for measuring at least the approximate frequency positions of one frequency selected from each of said arrays with respect to a frequency band having a width equal to the separation of adjacent frequencies in that array.

29. In a system for measuring a frequency, a plurality of harmonic local oscillators, separate frequency converters each responsive to a different one of said harmonic local oscillators and to said a frequency for generating a frequency array, said harmonic local oscillators having each a different frequency separation between adjacent harmonics, and means for measuring only one frequency of each of said frequency arrays.

30. The combination according to claim 29 wherein said last means comprises for each of said arrays an array of parallel fixed frequency band-pass filtering devices.

31. The combination according to claim 30 wherein all said filtering devices for all said arrays are of approximately the same band pass.

32. The combination according to claim 31 wherein the numbers of said filtering devices in different ones of said arrays of filtering devices have no common factor.

33. The combination according to claim 31 wherein the numbers of said filtering devices in certain of said arrays of filtering devices have a common factor.

34. In a system for measuring the frequency of a signal, means for measuring the frequency position of said signal with respect to each of a plurality of frequency intervals, each of said intervals being different, said last named means for each interval comprising; means for generating a plurality of local oscillator frequencies, adjacent ones of said local oscillator frequencies in each interval differing by a predetermined one of said frequency intervals, said local oscillator frequencies in each of said intervals being harmonically related to a single reference frequency, and means for mixing said signal with said local oscillator frequencies.

* * * * *